United States Patent
Kaur

(10) Patent No.: US 8,539,446 B2
(45) Date of Patent: *Sep. 17, 2013

(54) REDUCED INTEROPERABILITY VALIDATION SETS FOR MULTI-FEATURE PRODUCTS

(76) Inventor: Satwant Kaur, San Jose, CA (US)

( * ) Notice: Subject to any disclaimer, the term of this patent is extended or adjusted under 35 U.S.C. 154(b) by 714 days.

This patent is subject to a terminal disclaimer.

(21) Appl. No.: 12/709,540

(22) Filed: Feb. 22, 2010

(65) Prior Publication Data

US 2011/0209123 A1 Aug. 25, 2011

(51) Int. Cl.
*G06F 9/44* (2006.01)
*G06F 9/45* (2006.01)

(52) U.S. Cl.
USPC ............ 717/121; 717/106; 717/123; 717/131

(58) Field of Classification Search
USPC .................................. 717/100–150
See application file for complete search history.

(56) References Cited

U.S. PATENT DOCUMENTS

| | | |
|---|---|---|
| 2004/0243968 A1 | 12/2004 | Hecksel |
| 2010/0192135 A1 | 7/2010 | Krishnaswamy et al. |
| 2010/0235433 A1* | 9/2010 | Ansari et al. ................. 709/203 |
| 2011/0209124 A1* | 8/2011 | Kaur ............................. 717/126 |

OTHER PUBLICATIONS

Office Action for U.S. Appl. No. 12/765,426, mailed on Feb. 28, 2013, 13 pages.

\* cited by examiner

*Primary Examiner* — Chuck Kendall
(74) *Attorney, Agent, or Firm* — Jordan IP Law, LLC

(57) ABSTRACT

Systems and methods of validating multi-feature products can provide for identifying a feature combination for a product, and expanding the feature combination to include additional features only if the additional features are interoperable with all features in the feature combination and the additional features are new to the feature combination. The feature combination and the expanded feature combination may be added to a validation set for the product, wherein the validation set can be used to validate various platform configurations of the product.

20 Claims, 3 Drawing Sheets

FIG. 1
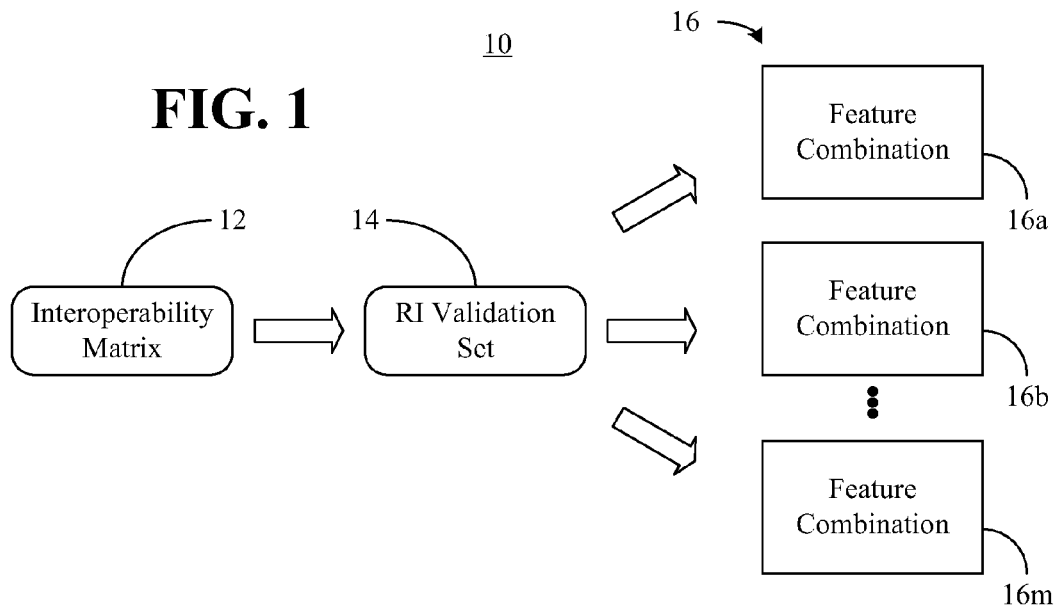
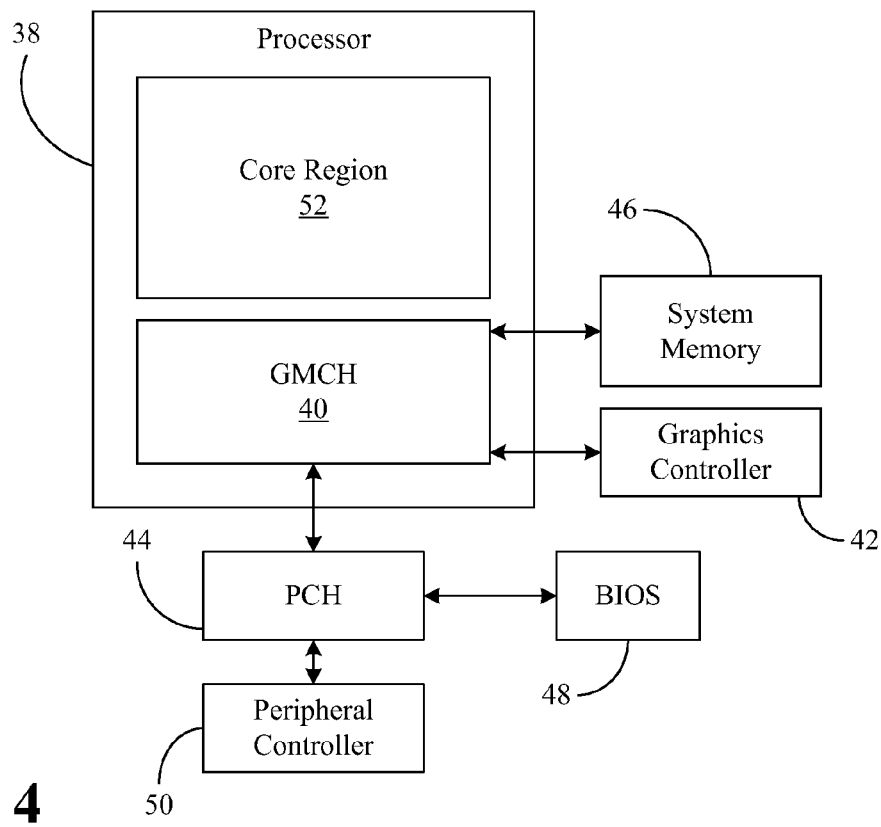
FIG. 4

34

```
function getFullyInteroperableFeatureCombos(interopMatrix):
    Queue combosToExtend = [ ]
    combosToExtend.enque( [ ] ) //init with 1 element: the empty set
    List combosToReturn = [ ]
    while not combosToExtend.isEmpty():
        comboToExtend = combosToExtend.dequeue( )
        newCombos = extendCombo(comboToExtend, interopMatrix)
        combosToExtend.addAll( newCombos )
        combosToReturn.add( combo )
    return combosToReturn;

function extendCombo(comboToExtend, interopMatrix):
    extendedCombos = { }
    minf = -1      //new feature must be greater than other features of this combo
    if not comboToExtend.isEmpty():
        minf = comboToExtend.lastElement()
    for newf between (minf+1, M.length()): //try every possible new feature
        if interoperableWithAll(comboToExtend, newf, interopMatrix):
            newCombo = new List(combosToExtend)
            newCombo.add(newf );
            extentedCombos.append( newCombo );
    return extendedCombos;

function interoperableWithAll(comboToExtend, newf, M)
    foreach oldf in comboToExtend:
        if not M[oldf][newf] == 1:
            return false;
    return true;
```

FIG. 3

REDUCED INTEROPERABILITY VALIDATION SETS FOR MULTI-FEATURE PRODUCTS

BACKGROUND

1. Technical Field

Embodiments generally relate to product validation. In particular, embodiments relate to the generation of reduced interoperability validation sets for multi-feature products.

2. Discussion

Conventional approaches to platform interoperability validation may involve testing more feature combinations and/or platform configurations than necessary, expending a substantial amount of manual effort to reduce the number of feature combinations to be tested, or both. For example, a platform with n features could result in $2^n$ feature combinations to be validated on each platform configuration. Accordingly, a platform with twenty features might have more than a million feature combinations that may potentially be validated on each of hundreds of platform configurations, and validating each feature combination may further require thousands of test cases.

BRIEF DESCRIPTION OF THE DRAWINGS

The various advantages of the embodiments of the present invention will become apparent to one skilled in the art by reading the following specification and appended claims, and by referencing the following drawings, in which:

FIG. 1 is a block diagram of an example of a scheme of minimizing feature combinations for a product according to an embodiment;

FIG. 3 is a listing of an example of pseudo code to generate a reduced interoperability validation set according to an embodiment; and FIG. 4 is a block diagram of an example of a system according to an embodiment.

DETAILED DESCRIPTION

Figure 2:
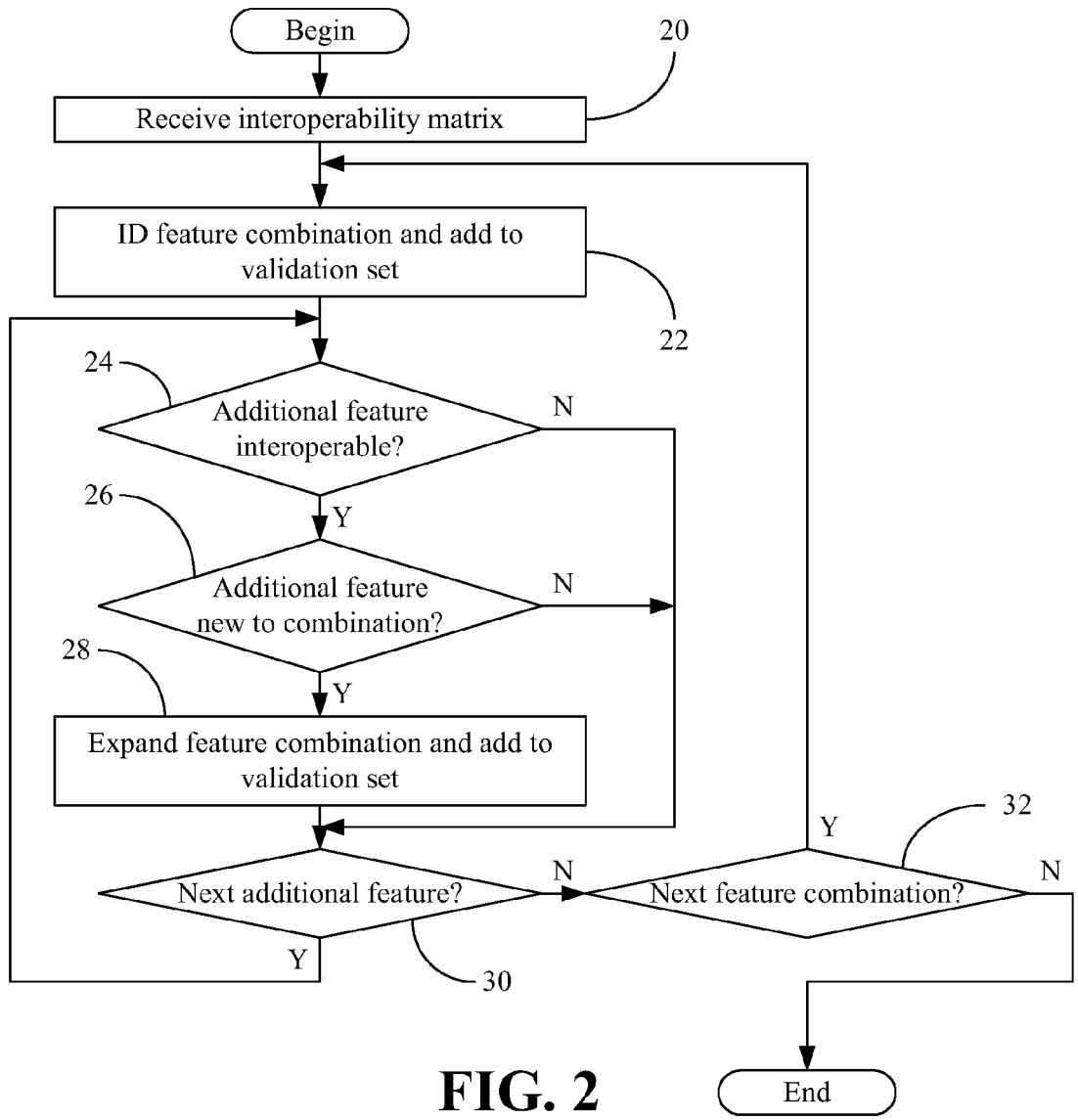
FIG. 2 is a flowchart of an example of a method of generating a reduced interoperability validation set according to an embodiment.

Embodiments may provide for a computer readable storage medium comprising a set of instructions which, if executed by a processor, cause a computer to identify a feature combination for a product, and expand the feature combination to include an additional feature only if the additional feature is interoperable with all features in the feature combination and the additional feature is new to the feature combination. The instructions may also cause a computer to add the feature combination and the expanded feature combination to a validation set for the product.

Embodiments may also provide for a system including a processor and a memory including a set of stored instructions which, if executed by the processor, cause the system to identify a feature combination for a product. The instructions may also cause the system to expand the feature combination to include an additional feature only if the additional feature is interoperable with all features in the feature combination and the additional feature is new to the feature combination, and add the feature combination and the expanded feature combination to a validation set for the product.

Embodiments may also provide for a method of evaluating a platform in which an interoperability matrix is received. The interoperability matrix can indicate a level of operability of each feature of a platform with each other feature of the platform. The method can also involve identifying a feature combination based on the interoperability matrix, and expanding the feature combination to include an additional feature only if the additional feature is interoperable with all features in the feature combination and the additional feature is new to the feature combination. The feature combination and the expanded feature combination can be added to a validation set for the platform. The method may further involve testing the platform based on the validation set.

FIG. 1 shows a scheme 10 of minimizing feature combinations for a multi-feature product to be validated. The product might be a platform with computing functionality (e.g., laptop, desktop, server, personal digital assistant/PDA), communications functionality (e.g., wireless phone), imaging functionality, media playing functionality, or any combination thereof. In addition, the product could be a vehicle (e.g., automobile, aircraft), business machine (e.g., copier, printer, facsimile machine, scanner), or other multi-feature product whose features should interoperate correctly. In the case of a computing platform, for example, the features might be related to dynamic power performance management (DPPM), hybrid graphics, active management technology (e.g., AMT 7.0, Intel® Corporation), identity protection technology, video playback data path protection (e.g., PAVP 2.0, Intel® Corporation), basic input/output system (BIOS) attribute management, and so on. The illustrated example provides for transforming an interoperability matrix 12 into a reduced interoperability (RI) validation set 14, which in turn provides for a plurality of feature combinations 16 (16a-16m) to be tested in one or more product configurations. As will be discussed in greater detail, the illustrated RI validation set 14 can significantly reduce the product validation overhead, time and cost by minimizing the number of feature combinations 16 to be tested.

Generally, the interoperability matrix 12 can indicate the level of operability of each feature of the product with respect to each other feature of the product. For example, Table 1 below demonstrates one approach in which the level of operability indicates whether a feature is interoperable (1), incompatible (−1), or non-intersecting (0) with another feature of the product.

TABLE 1

| Interop. Matrix | Feature A | Feature B | Feature C | Feature D | Feature E | Feature F |
|---|---|---|---|---|---|---|
| Feature A | 1 | 1 | 0 | 0 | 1 | 0 |
| Feature B | 1 | 1 | −1 | 0 | 1 | 0 |
| Feature C | 0 | 1 | 1 | 1 | 1 | 1 |
| Feature D | 0 | 0 | 1 | 1 | 1 | 1 |
| Feature E | 1 | 1 | 1 | 1 | 1 | 1 |
| Feature F | 0 | 0 | 1 | 1 | 1 | 1 |

The interoperability matrix 12 may be generated by carrying out interoperability architectural assessments of features on the product. For example, each feature architect might list the interoperability of their feature with every other feature. Even if there is only partial evidence that a feature pair is interoperable, an entry can be included for validation consideration. The result may be a symmetrical matrix where interoperability $[f_i, f_j]$=interoperability $[f_j, f_i]$.

FIG. 2 shows a method 18 of generating an RI validation set 14 (FIG. 1) based on an interoperability matrix 12 (FIG. 1). The method 18 may be implemented in executable software as a set of logic instructions stored in a machine- or computer-readable medium of a memory such as random access memory (RAM), read only memory (ROM), programmable ROM (PROM), flash memory, etc., in fixed-functionality hardware using circuit technology such as application specific integrated circuit (ASIC), complementary metal oxide semiconductor (CMOS) or transistor-transistor logic (TTL) technology, or any combination thereof. For example, computer program code to carry out operations shown in method 18 may be written in any combination of one or more programming languages, including an object oriented programming language such as C++ or the like and conventional procedural programming languages, such as the "C" programming language or similar programming languages.

The illustrated approach generally leverages the fact that that any non-fully interoperable feature combination (i.e., a combination containing a feature that is not interoperable with all other features) may not be required for full validation. Moreover, if a feature combination contains a feature incompatible with any other feature, it may be considered an invalid combination. In addition, if a feature combination contains feature that does not intersect with any other feature, the combination does not expose any new vulnerabilities above and beyond the set of fully interoperable subsets of the combination.

In particular, the illustrated processing block 20 provides for receiving an interoperability matrix. An interoperable feature combination can be identified at block 22 based on the interoperability matrix, wherein the feature combination might two-feature combination (i.e., feature pair). Block 22 may also add the feature combination to an RI validation set 14 (FIG. 1). Illustrated block 24 provides for determining whether an additional feature is interoperable with all features in the feature combination. If so, a determination may be made at block 26 as to whether the additional feature is new to the combination. If both conditions are true the feature combination may be expanded at block 28 to include the additional feature, and the expanded feature combination can be added to the RI validation set 14 (FIG. 1). Otherwise, the feature combination is not expanded to include the additional feature. Illustrated block 30 checks for other additional features to be considered, and provides for repeating the selective expansion process if another additional feature is present in the interoperability matrix. If another feature combination is present in the interoperability matrix, block 32 can provide for selecting the next feature combination and repeating the selective expansion process. The resulting RI validation set may be used to test the product in question.

Accordingly, the RI validation set 14 (FIG. 1) can be substantially smaller than it may normally be under conventional brute force techniques. For example, Table 2 below demonstrates an RI validation set in matrix format for the interoperability matrix shown in Table 1, wherein the "1" entries show which features are part of the combination to be validated.

TABLE 2

| Combo to be Validated | Feature A | Feature B | Feature C | Feature D | Feature E | Feature F |
|---|---|---|---|---|---|---|
| 1 | 1 | 1 | 0 | 0 | 0 | 0 |
| 2 | 1 | 0 | 0 | 0 | 1 | 0 |
| 3 | 0 | 1 | 0 | 0 | 1 | 0 |
| 4 | 0 | 0 | 1 | 1 | 0 | 0 |
| 5 | 0 | 0 | 1 | 0 | 1 | 0 |
| 6 | 0 | 0 | 1 | 0 | 0 | 1 |
| 7 | 0 | 0 | 0 | 1 | 1 | 0 |
| 8 | 0 | 0 | 0 | 1 | 0 | 1 |
| 9 | 0 | 0 | 0 | 0 | 1 | 1 |

TABLE 2-continued

| Combo to be Validated | Feature A | Feature B | Feature C | Feature D | Feature E | Feature F |
|---|---|---|---|---|---|---|
| 10 | 1 | 1 | 0 | 0 | 1 | 0 |
| 11 | 0 | 0 | 1 | 1 | 1 | 0 |
| 12 | 0 | 0 | 1 | 1 | 0 | 1 |
| 13 | 0 | 0 | 1 | 0 | 1 | 1 |
| 14 | 0 | 0 | 0 | 1 | 1 | 1 |
| 15 | 0 | 0 | 1 | 1 | 1 | 1 |

Thus, the complete set of combinations to be validated can be substantially smaller than the $2^n$ possible combinations that may result from the conventional approach, and yet enables validation all of the potential vulnerabilities of the platform as captured in the interoperability matrix.

It has been determined that the reduction in the number of validations may vary with the sparseness of "1's" in the interoperability matrix. Table 3 below demonstrates the number of feature combinations and the maximum feature size as the sparseness of the "1's" in the interoperability matrix is varied.

TABLE 3

| Test # | Density of 1's in Interoperability Matrix | Longest Feature Combos (max 20) | No. of Feature Combo (max 1,048,576) |
|---|---|---|---|
| 1 | 32% | 5 | 125 |
| 2 | 38% | 6 | 236 |
| 3 | 43% | 6 | 328 |
| 4 | 48% | 7 | 520 |
| 5 | 61% | 7 | 1260 |
| 6 | 80% | 11 | 13824 |

FIG. 3 shows one example of pseudo code 34 capable of generating an RI validation set based on an interoperability matrix (e.g., argument "interopMatrix"). Generally, the illustrated pseudo code 34 selectively extends each n feature combination to generate multiple n+1 feature combinations. Each of the n+1 feature combinations can be created by appending an additional feature that is interoperable (e.g., function "interoperableWithAll") with all existing n features in the combination. The initial set may begin with one two-feature combination, and the algorithm can terminate when no new combinations can be formed by extending an existing combination. The illustrated pseudo code 34 also allows appending an additional feature only when the extended combination will be "greater" (according to any consistent ordering) than all existing features in the combination (e.g., function "extendCombo"). Simply put, a feature combination may be expanded only if the additional feature is new to the feature combination. Such an approach can enable the system to avoid regenerating different permutations of the same feature set.

Turning now to FIG. 4, a computing system 36 is shown. The system 36 may be a portion of a computing platform such as a server, desktop, test system, design/debug tool, laptop, personal digital assistant (PDA), mobile Internet device (MID), wireless smart phone, media player, imaging device, or any other suitable apparatus. In the illustrated example, the system 36 includes a processor 38, a graphics memory controller hub (GMCH) 40, a graphics controller 42, a platform controller hub (PCH) 44, system memory 46, basic input/output system (BIOS) memory 48 and one or more peripheral controllers 50. The illustrated processor 38, which may include a core region 52 with one or several processor cores and various cache levels (not shown), is integrated with the GMCH 40 onto a common system on chip (SoC). Alternatively, the processor 38 could communicate with the GMCH 40 over an interface such as a front side bus (FSB), a point-to-point interconnect fabric, or any other suitable interface. The GMCH 40, which is sometimes referred to as a Northbridge, can communicate with the system memory 46 via a memory bus, wherein the system memory 46 might include dynamic random access memory (DRAM) modules that could be incorporated into a single inline memory module (SIMM), dual inline memory module (DIMM), small outline DIMM (SODIMM), and so on.

The GMCH 40 may also communicate with the graphics controller 42 via a graphics bus such as a PCI Express Graphics (PEG, e.g., Peripheral Components Interconnect/PCI Express x16 Graphics 150W-ATX Specification 1.0, PCI Special Interest Group) bus, or Accelerated Graphics Port (e.g., AGP V3.0 Interface Specification, September 2002) bus. In addition, the GMCH 40 may communicate with the PCH 44, which may be referred to as a Southbridge, over a hub bus. In one embodiment, the hub bus is a DMI (Direct Media Interface) bus. The PCH 44 could also be incorporated with the processor 38 and GMCH 40 onto a common SoC. The illustrated system 36 also has one or more peripheral controllers 50 such as a Wi-Fi (e.g., Institute of Electronics Engineers/IEEE 802.11a, b, g, n) network interface, an Ethernet controller (e.g., IEEE 802.3), PC Card controller (e.g., CardBus PCMCIA standard), and so on. Thus, the peripheral controllers 50 may provide access to external memory such as a hard disk drive (HDD), optical disk, and/or flash memory.

The PCH 44 may also have internal controllers such as USB (Universal Serial Bus, e.g., USB Specification 2.0, USB Implementers Forum), Serial ATA (SATA, e.g., SATA Rev. 3.0 Specification, May 27, 2009, SATA International Organization/SATA-IO), High Definition Audio, and other controllers.

Thus, the system memory 46, external memory, and/or caches of the processor 38 may be configured to store a set of instructions which, if executed by the processor 38, cause the system 36 to identify a feature combination for a product, and expand the feature combination to include an additional feature only if the additional feature is interoperable with all features in the feature combination and the additional feature is new to the feature combination. The instructions could also add the feature combination and the feature combination to a validation set for the product.

The above techniques may therefore provide for a validation set that is complete (e.g., can exercise all multi-dimensional interoperability vulnerabilities), non-redundant (e.g., may eliminate duplication of feature level validation on different platform configurations, small-sized (e.g., can minimize the size of combinations to be validated), minimal (e.g., may be a function of the density of input feature level interactions—reducing the number of combinations from more than a million to a few hundred), and unique (e.g., can have a signature that is unique to the input interoperability matrix). The result may be a reduction in the validation resources required, including personnel and computer hardware. Moreover, significant reductions in cost and time to market can be realized using the techniques described herein.

Embodiments described herein are applicable for use with all types of semiconductor integrated circuit ("IC") chips. Examples of these IC chips include but are not limited to processors, controllers, chipset components, programmable logic arrays (PLA), memory chips, network chips, and the like. In addition, in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

I claim:

1. A method comprising utilizing a processor causing:
   receiving an interoperability matrix, wherein the interoperability matrix indicates a level of operability of each feature of a platform with each other feature of the platform;
   identifying a feature combination based on the interoperability matrix;
   expanding the feature combination to include an additional feature only if the additional feature is interoperable with all features in the feature combination and the additional feature is new to the feature combination;
   adding the feature combination and the expanded feature combination to a validation set for the platform; and
   testing the platform based on the validation set.

2. The method of claim 1, wherein the level of operability indicates whether a feature is interoperable, incompatible or non-intersecting with another feature of the platform.

3. The method of claim 1, wherein the feature combination includes a two-feature combination.

4. The method of claim 1, further including repeating the expanding and adding for a plurality of features.

5. The method of claim 4, further including repeating the identifying, expanding and adding for a plurality of feature combinations.

6. The method of claim 1, wherein the platform is a computing platform.

7. A computer readable storage medium comprising a set of instructions which, if executed by a processor, cause a computer to:
   identify a feature combination for a product;
   expand the feature combination to include an additional feature only if the additional feature is interoperable with all features in the feature combination and the additional feature is new to the feature combination; and
   add the feature combination and the expanded feature combination to a validation set for the product.

8. The medium of claim 7, wherein the instructions, if executed, cause a computer to:
   receive an interoperability matrix; and
   identify the feature combination based on the interoperability matrix.

9. The medium of claim 8, wherein the interoperability matrix is to indicate a level of operability of each feature of the product with respect to each other feature of the product.

10. The medium of claim 9, wherein the level of operability indicates whether a feature is interoperable, incompatible or non-intersecting with another feature of the product.

11. The medium of claim 8, wherein the feature combination is to include a two-feature combination.

12. The medium of claim 7, wherein the instructions, if executed, cause a computer to repeat the expanding and adding for a plurality of features.

13. The medium of claim 12, wherein the instructions, if executed, cause a computer to repeat the identifying, expanding and adding for a plurality of feature combinations.

14. A system comprising:
   a processor; and
   a memory including a set of stored instructions which, if executed by the processor, cause the system to,
      identify a feature combination for a product,
      expand the feature combination to include an additional feature only if the additional feature is interoperable with all features in the feature combination and the additional feature is new to the feature combination, and
      add the feature combination and the expanded feature combination to a validation set for the product.

15. The system of claim 14, wherein the instructions, if executed, cause the system to:
   receive an interoperability matrix, and
   identify the feature combination based on the interoperability matrix.

16. The system of claim 15, wherein the interoperability matrix is to indicate a level of operability of each feature of the product with respect to each other feature of the product.

17. The system of claim 16, wherein the level of operability indicates whether a feature is interoperable, incompatible or non-intersecting with another feature of the product.

18. The system of claim 15, wherein the feature combination is to include a two-feature combination.

19. The system of claim 14, wherein the instructions, if executed, cause the system to repeat the expanding and adding for a plurality of features.

20. The system of claim 19, wherein the instructions, if executed, cause the system to repeat the identifying, expanding and adding for a plurality of feature combinations.

* * * * *